US012690119B2

(12) United States Patent
Paavola et al.

(10) Patent No.: US 12,690,119 B2
(45) Date of Patent: Jul. 21, 2026

(54) TOP SIDE FRAME STIFFENER STRUCTURE FOR A PRINTED CIRCUIT BOARD (PCB) STACK

(71) Applicant: Intel Corporation, Santa Clara, CA (US)

(72) Inventors: Juha T. Paavola, Hillsboro, OR (US); Kari Pekka Johannes Mansukoski, Hillsboro, OR (US); Sami M. Heinisuo, Dallas, OR (US); Cody K. Hougnon, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 68 days.

(21) Appl. No.: 17/902,552

(22) Filed: Sep. 2, 2022

(65) Prior Publication Data

US 2022/0418083 A1     Dec. 29, 2022

(51) Int. Cl.
*H05K 1/02* (2006.01)
*H05K 1/181* (2026.01)

(52) U.S. Cl.
CPC ........... *H05K 1/0203* (2013.01); *H05K 1/181* (2013.01); *H05K 2201/10734* (2013.01)

(58) Field of Classification Search
CPC ................. H05K 1/0203; H05K 1/181; H05K 2201/10734
USPC ........................................................ 361/720
See application file for complete search history.

(56) References Cited

U.S. PATENT DOCUMENTS

2018/0026016 A1* 1/2018 Tao ..................... H01L 23/5283
                                                                              257/774
2020/0411410 A1* 12/2020 Klein .................... H01L 23/427
2021/0057318 A1* 2/2021 Sir ........................ H05K 3/4015
2022/0386510 A1* 12/2022 Chen .................... H05K 1/0203

* cited by examiner

*Primary Examiner* — Zhengfu J Feng
(74) *Attorney, Agent, or Firm* — Alliance IP, LLC

(57) ABSTRACT

A top side frame stiffener structure for a printed circuit board (PCB) stack. The structure is placed between a cooling component and a backing plate, in an area surrounding a substrate package. The structure does not cause the overall height of the PCB stack to increase.

25 Claims, 8 Drawing Sheets

200

Z

X

216

218

214

202

216

218

210

212

208

222

218 216

230

202

212

216 218

214

210

222

206

Y

X

500

502

TOP SIDE FRAME STIFFENER STRUCTURE FOR A PRINTED CIRCUIT BOARD (PCB) STACK

BACKGROUND

A printed circuit board (PCB) "stack" is like a sandwich structure, generally having a backing plate at the bottom, a cooling component at the top, and a CPU package at a neutral axis in the middle. The various types of cooling components and methods for attachment can introduce technical problems.

DETAILED DESCRIPTION

Figure 1A:
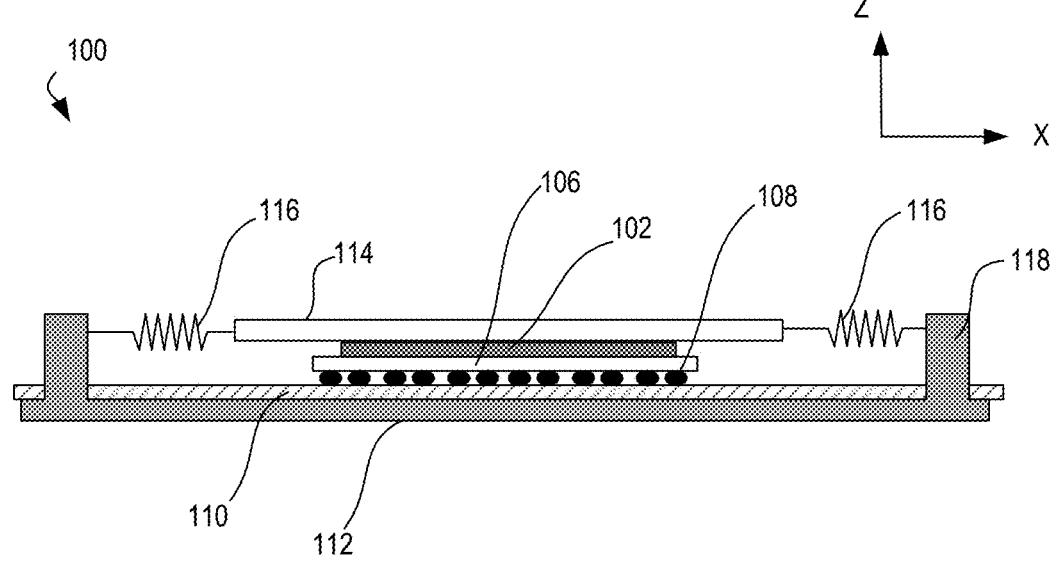
FIGS. 1A-1B are simplified illustrations of a printed circuit board (PCB) stack, in accordance with various embodiments.

A printed circuit board (PCB) "stack" generally has a sandwich structure, with a backing plate at the bottom, a cooling component at the top, and a CPU package at a neutral axis in the middle. In an example, a ball grid array (BGA) system stack includes, from the bottom side to the top side: a backing plate (BP), a motherboard (PCB), a solder layer (BGA), a package substrate, a die, and a cooling component. The cooling component may include a cold plate (CP) and heat pipe (HP) or a vapor chamber (VC).

Some cooling components are attached by springs located external to the stack. Having springs located external to the stack reduces the stack stiffness significantly and increases board deflection during a shock loading. A high board deflection is an undesirable technical problem because it results in a lower solder joint reliability (SJR). This technical problem is especially observed in stacks that use coil springs, typically in cooling components that are vapor chamber (VC) solutions.

Embodiments provide a technical solution to this technical problem and other related enhancements, in the form of a top side frame stiffener structure for a PCB stack. Embodiments provide enhanced SJR and stack stiffness, as compared to available PCB stack solutions.

In the following description, specific details are set forth, but embodiments of the technologies described herein may be practiced without these specific details. Well-known circuits, structures, and techniques have not been shown in detail to avoid obscuring an understanding of this description. Phrases such as "an embodiment," "various embodiments," "some embodiments," and the like may include features, structures, or characteristics, but not every embodiment necessarily includes the particular features, structures, or characteristics.

Some embodiments may have some, all, or none of the features described for other embodiments. "First," "second," "third," and the like describe a common object and indicate different instances of like objects being referred to. Such adjectives do not imply objects so described must be in a given sequence, either temporally or spatially, in ranking, or any other manner. "Connected" may indicate elements are in direct physical or electrical contact with each other and "coupled" may indicate elements co-operate or interact with each other, but they may or may not be in direct physical or electrical contact. Furthermore, the terms "comprising," "including," "having," and the like, as used with respect to embodiments of the present disclosure, are synonymous.

As used herein, the phrase "located on" in the context of a first layer or component located on a second layer or component refers to the first layer or component being directly physically attached to the second part or component (no layers or components between the first and second layers or components) or physically attached to the second layer or component with one or more intervening layers or components. For example, with reference to FIGS. 2A-2B, the integrated circuit component die 202 is located on the package substrate 206.

As used herein, the term "adjacent" refers to layers or components that are in physical contact with each other. That is, there is no layer or component between the stated adjacent layers or components. For example, a layer X that is adjacent to a layer Y refers to a layer that is in physical contact with layer Y.

As used herein, the terms "processor unit", "processing unit" or "processor" may refer to any device or portion of a device that processes electronic data from registers and/or memory to transform that electronic data into other electronic data that may be stored in registers and/or memory. A processor unit may be a system-on-a-chip (SOC), and/or include one or more digital signal processors (DSPs), application-specific integrated circuits (ASICs), central processing units (CPUs), graphics processing units (GPUs), general-purpose GPUs (GPGPUs), accelerated processing units (APUs), field-programmable gate arrays (FPGAs), neural network processing units (NPUs), data processor units (DPUs), accelerators (e.g., graphics accelerator, compression accelerator, artificial intelligence accelerator), controller cryptoprocessors (specialized processors that execute cryptographic algorithms within hardware), server processors, controllers, or any other suitable type of processor units. As such, the processor unit can be referred to as an XPU (or xPU).

As used herein, the term "electronic component" can refer to an active electronic component (e.g., a processing unit, a memory, a storage device, a field effect transistor (FET)) or a passive electronic component (e.g., resistor, inductor, capacitor).

As used herein, the term "integrated circuit component" can comprise one or more of any electronic components described or referenced herein or any other computing system component, such as a processor unit, I/O controller, memory, or network interface controller. Further, the integrated circuit component may be unpackaged or packaged.

In one example of an unpackaged integrated circuit component, a single monolithic integrated circuit die comprises solder bumps attached to contacts on the die; the solder bumps allow the die to be directly attached to a printed circuit board (PCB). A packaged integrated circuit component can comprise one or more integrated circuit dies mounted on a package substrate with the integrated circuit dies and package substrate encapsulated in a casing material, such as a metal, plastic, glass, or ceramic. In one example, a packaged integrated circuit component has a solder ball grid array (BGA) on an exterior surface of the package substrate.

As used herein, the phrase "mechanically coupled" refers to components that are affixed or physically attached (as may be achieved by any combination of soldering, the use of adhesives, the use of fasteners, or the like) to each other, often, to achieve a resulting structure. In various embodiments, mechanically coupled can include releasably attached configurations, such as, those that require application of a torque exceeding a threshold torque to release them.

As may be appreciated by one with skill in the art, mechanically coupled is not necessarily mutually exclusive, a coupling between two components can facilitate more than one purpose.

Reference is now made to the drawings, which are not necessarily drawn to scale, wherein similar or same numbers may be used to designate same or similar parts in different figures. The use of similar or same numbers in different figures does not mean all figures including similar or same numbers constitute a single or same embodiment. Like numerals having different letter suffixes may represent different instances of similar components. The drawings illustrate generally, by way of example, but not by way of limitation, various embodiments discussed in the present document.

As may be appreciated, certain terminology, such as "ceiling" and "floor", as well as "upper,", "uppermost", "lower," "above," "below," "bottom," and "top" refer to directions based on viewing the Figures to which reference is made. Further, terms such as "front," "back," "rear,", "side", "vertical", and "horizontal" may describe the orientation and/or location of portions of the component within a consistent but arbitrary frame of reference which is made clear by reference to the text and the associated Figures describing the component under discussion. Such terminology may include the words specifically mentioned above, derivatives thereof, and words of similar import.

In the following description, for purposes of explanation, numerous specific details are set forth in order to provide a thorough understanding thereof. It may be evident, however, that the novel embodiments can be practiced without these specific details. In other instances, well known structures and devices are shown in block diagram form in order to facilitate a description thereof. The intention is to cover all modifications, equivalents, and alternatives within the scope of the claims.

Figure 1B:
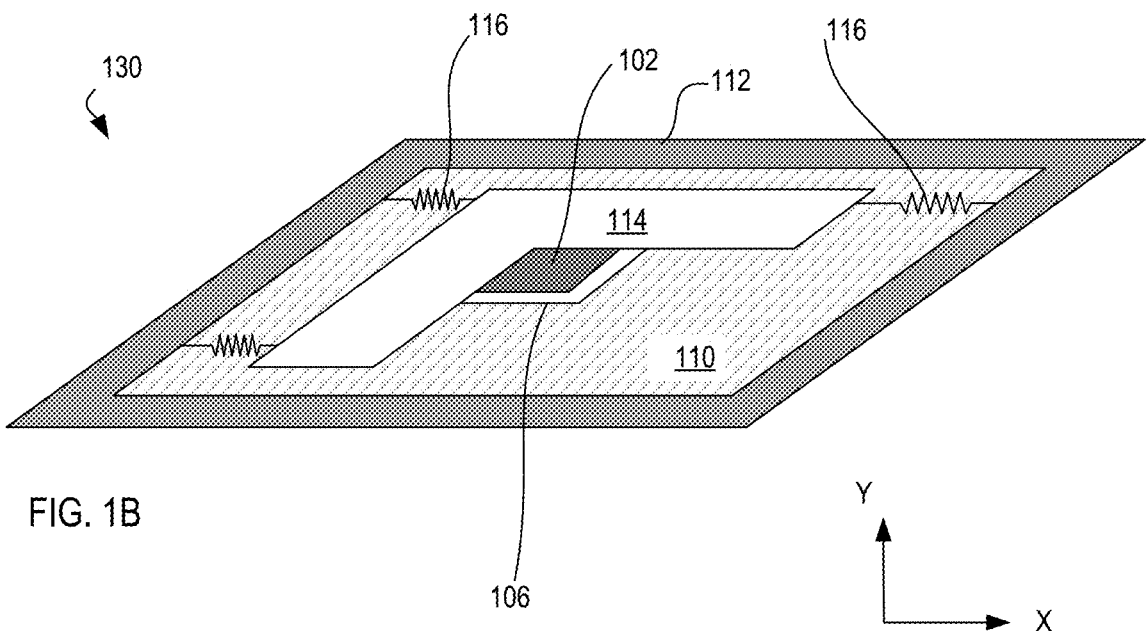

FIGS. 1A-1B illustrate a side view 100 and top view 130 of a printed circuit board (PCB) "stack," generally illustrating a sandwich structure. The stack comprises a backing plate 112 at the bottom, a cooling component 114 at the top, and a CPU package at a neutral axis in the middle. In the illustration, the CPU package includes die 102 attached to package substrate 106, and package substrate 106 attached to the PCB 110 via solder balls 108. The die 102 can be various embodiments of integrated circuit component die or processing units described herein, and there can be more or less than two die on the package substrate 106, as dictated by the target application. The cooling component 114 is shown attached to standoffs 118 via springs 116. In FIG. 1B, a portion of the cooling component 114 is shown cut away, to reveal the package substrate 106 and die 102.

Figure 2A:
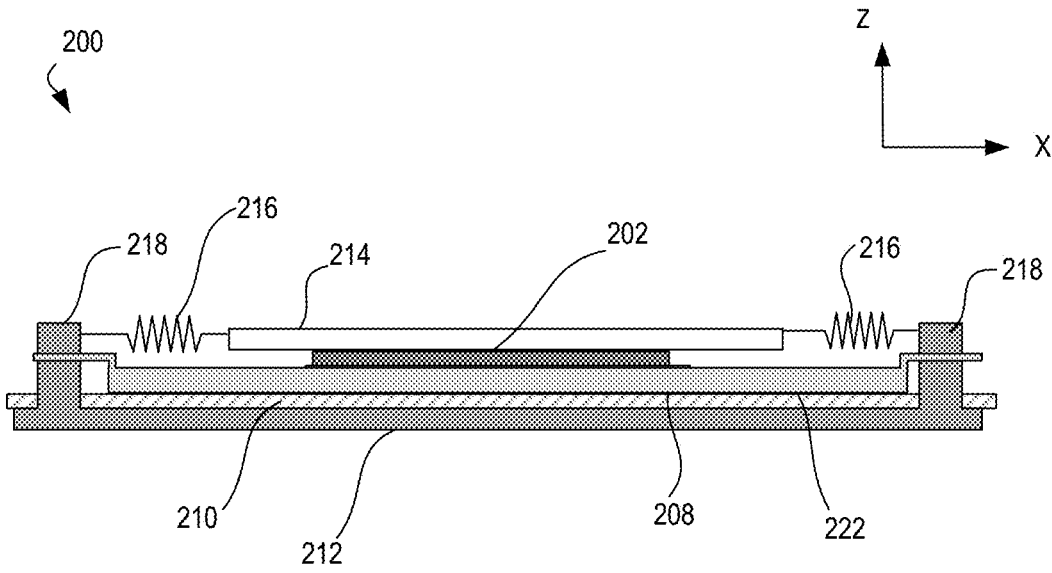
FIGS. 2A-2B are simplified illustrations of a printed circuit board (PCB) stack, with a top side frame stiffener structure, in accordance with various embodiments.
Figure 2B:
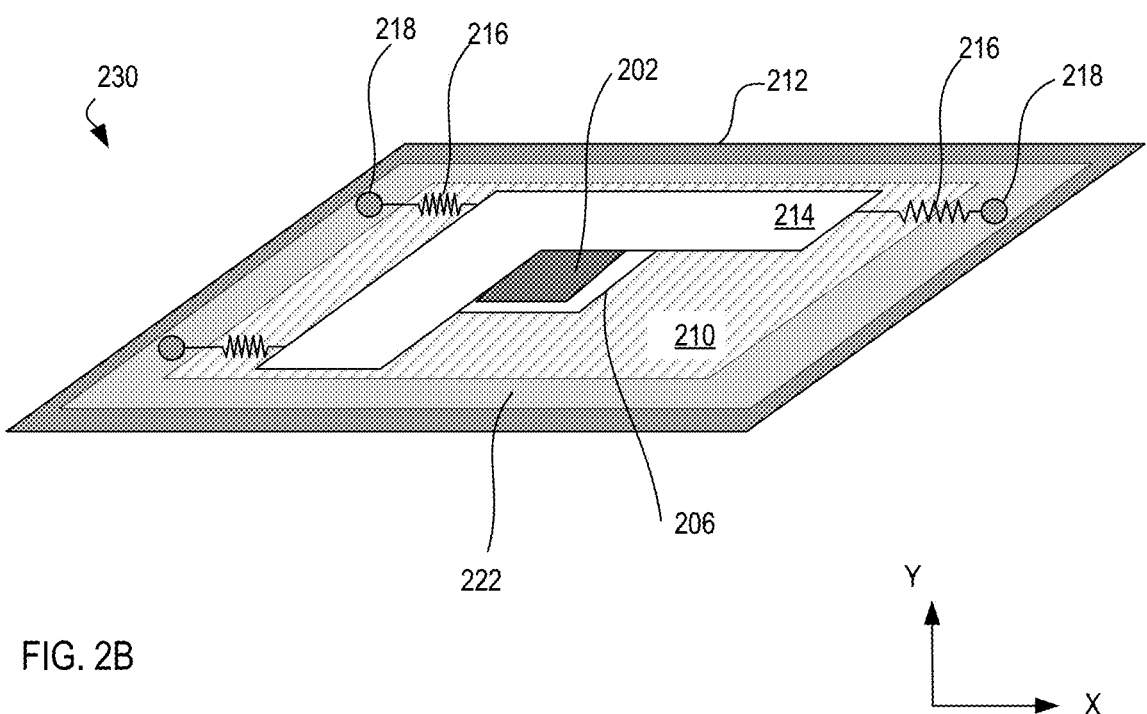

FIGS. 2A-2B illustrate a technically improved PCB stack, with a top side frame stiffener structure 222 added to the PCB stack of FIGS. 1A, 1B. In the side view 200 and top view 230, die 202 is attached to the package substrate 206, which is in turn, attached via solder balls 208 (obscured by the structure 222) to the PCB 210. The PCB 210 is attached to the backing plate 212, and the cooling component 214 is on top of the die 202. The cooling component 214 is shown attached to standoffs 218 via springs 216. In FIG. 2B, a portion of the cooling component 214 is shown cut away, to reveal the package substrate 206. The top side frame stiffener structure 222 is shown extending laterally around the die (202) package substrate 206.

Figure 3A:
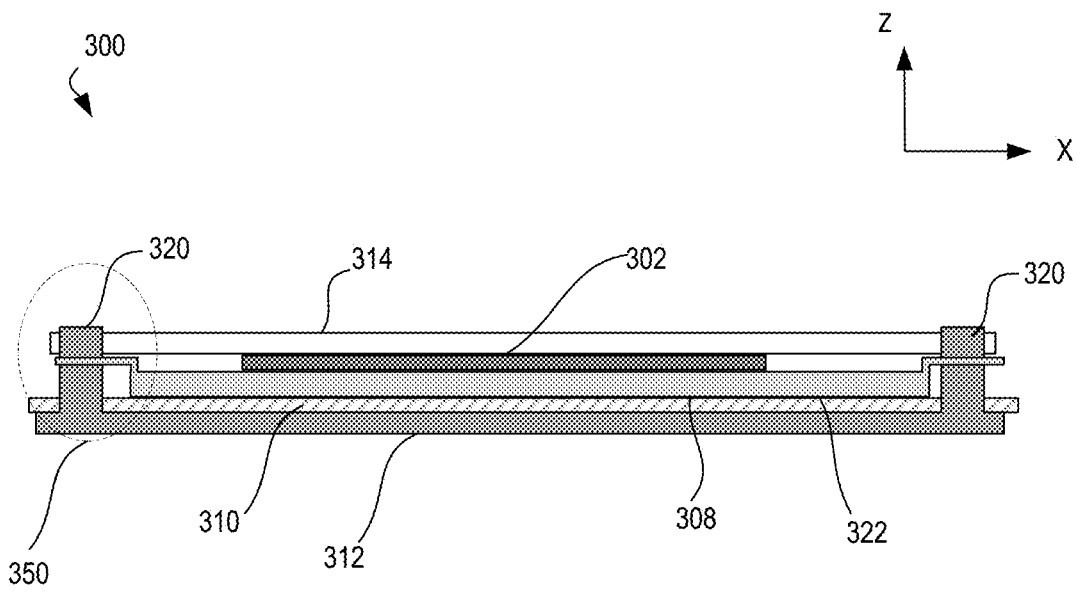
FIGS. 3A-3B are simplified illustrations of a printed circuit board (PCB) stack, with a top side frame stiffener structure, in accordance with various other embodiments.
Figure 3B:
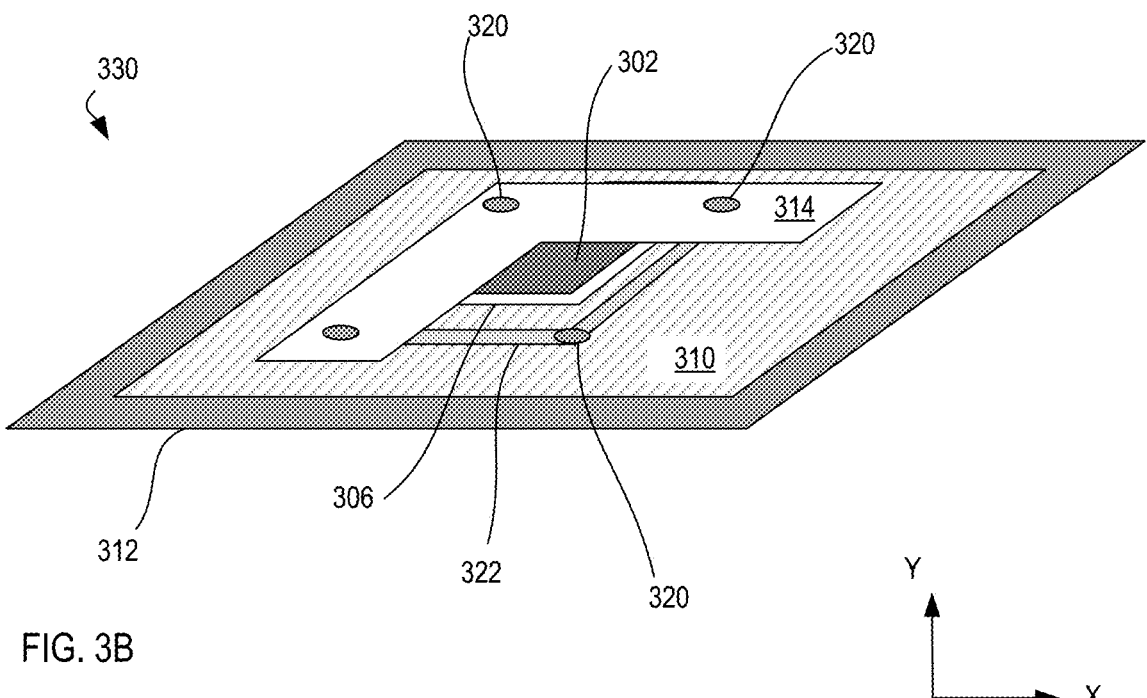

FIGS. 3A-3B illustrate another embodiment of a technically improved PCB stack, using a top side frame stiffener structure 322 for a PCB stack. In the side view 300 and top view 330, die 302 is attached to the package substrate, which is in turn, attached via solder balls 308 (obscured by structure 322) to the PCB 310. The PCB 310 is attached to the backing plate 312, and the cooling component 314 is on top of the die 302. The top side frame stiffener structure 322 is shown extending laterally around the die (302) package substrate 306. In this embodiment, standoffs 320 can be located internal to the PCB stack, under (and through) the cooling component 314. Standoffs 320 extend up through the cooling component, peripherally located with respect to the package substrate 306. Standoffs 320 comprise an opening oriented in the Z direction, and a fastening means may be used to attach components to the standoffs 320. Area 350 is shown enlarged in FIG. 4A, for discussion of the fastening means and stack methodology.

Figure 4A:
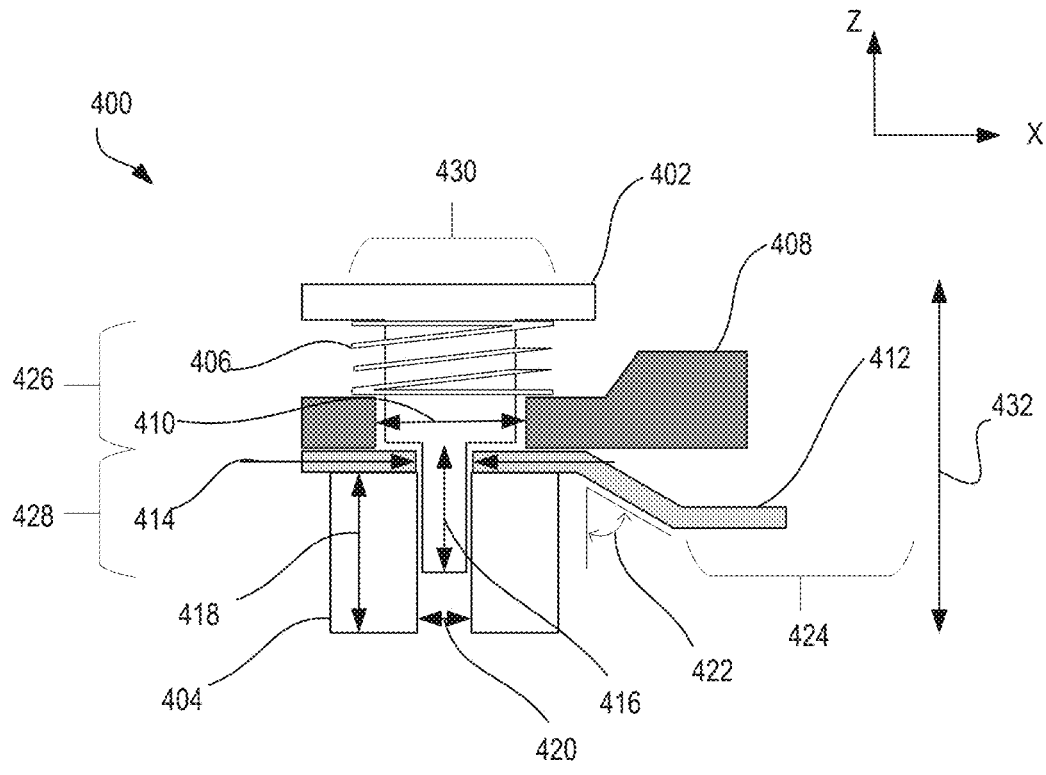
FIGS. 4A-4B are illustrations providing more detail for features of the top side frame stiffener structure, in accordance with various embodiments.

In FIG. 4A, an enlarged illustration of a portion 400 of the stack shows a fastener means 402 affixed into standoff 404, in accordance with various embodiments. The standoff 404 may extend substantially perpendicularly from a backing plate (e.g., backing plate 312) to a height 418, and have an opening therein. In various embodiments, the height is substantially 1.5 millimeters, wherein substantially means plus or minus 10%. Fastener means 402 has a first region 426 with a first diameter and a second region 428 with a smaller, second diameter. Diameters appear as widths in the side view of FIG. 4A.

A spring element 406 is coiled axially around at least part of the first region 426 of the fastener means 402, providing flexible compression in the Z direction. The spring element 406 has an inner diameter of about 0.6-0.7 millimeters, wherein about means plus or minus 5%. The spring element 406 has an outer diameter 430, as shown, which may be in a range of about 4-5 millimeters.

The cooling component 408 comprises an opening (with an axis in the Z direction, as shown) located therein to align with the opening in the standoff 404. The opening in the cooling component 408 has a diameter 410 larger than the first diameter, such that the opening does not bind to first region 426, but smaller than the outer diameter 430 of the spring element 406. In various embodiments, the diameter 410 of the opening in the cooling component is about 0.2 mm larger than the first diameter, or essentially providing a gap of about 0.1 millimeter on each side.

In the second region 428, a portion of the fastener means 402 extends vertically into the opening 420 of the standoff 404, to length 416. In various embodiments, the fastener means is a screw, and the portion with length 416 is threaded to mate with corresponding threads in the opening 420 of the standoff 404. In some embodiments, the thread of the second region 428 is a m1.6 or m2, meaning that it is a metric thread of 1.6 millimeters or metric thread of 2 millimeters. Accordingly, adjusting the fastener means tightens the compression on the spring element, and the combination of the fastener means 402 and spring element 406 can secure the cooling component 408 to the standoff 404 by compression. As used herein, the fastener means 402 and spring element 406 may be referred to as a spring-loaded fastener.

An advantage of this design is that the top side frame stiffener is fastened to the backing plate standoff 404, but not attached to the cooling component 408. In various embodiments, the cooling component 408 is a vapor chamber. The spring element 406 has a lateral load transfer capability that is, by design, low, allowing lateral (horizontal) movement of the cooling component under small loads; e.g., for a spring element with a vertical load of 4 lbf (pound force), a PCB stack may employ 6 springs to achieve a total of 24 lbf, estimated to be that of a mobile device substrate package load. The corresponding lateral retention force with a friction coefficient of 0.2 is only 0.8 lbf, or 1.8N (newtons).

In various embodiments, the top side frame stiffener structure 412 (also shortened to "structure" herein) is added to the stack below the cooling component 408 and around a periphery of the substrate package, such that it is not over the top of the package substrate and its presence does not require increasing the overall height 432 of the stack, as illustrated in FIG. 4A. The top side frame stiffener structure 412 has an opening with a diameter 414 that is smaller than the diameter 410, but larger than the diameter of opening 420. When viewed moving laterally away from the standoff 404 (e.g., left to right in the figure), the structure 412 may have regions that are bent or stamped into a shape to fit in available open space under the cooling component 408, without requiring that the overall height 432 of the stack be increased. In a non-limiting example, the structure 412 has a bend at angle 422, and then is bent again to create a lateral region 424.

Figure 4B:
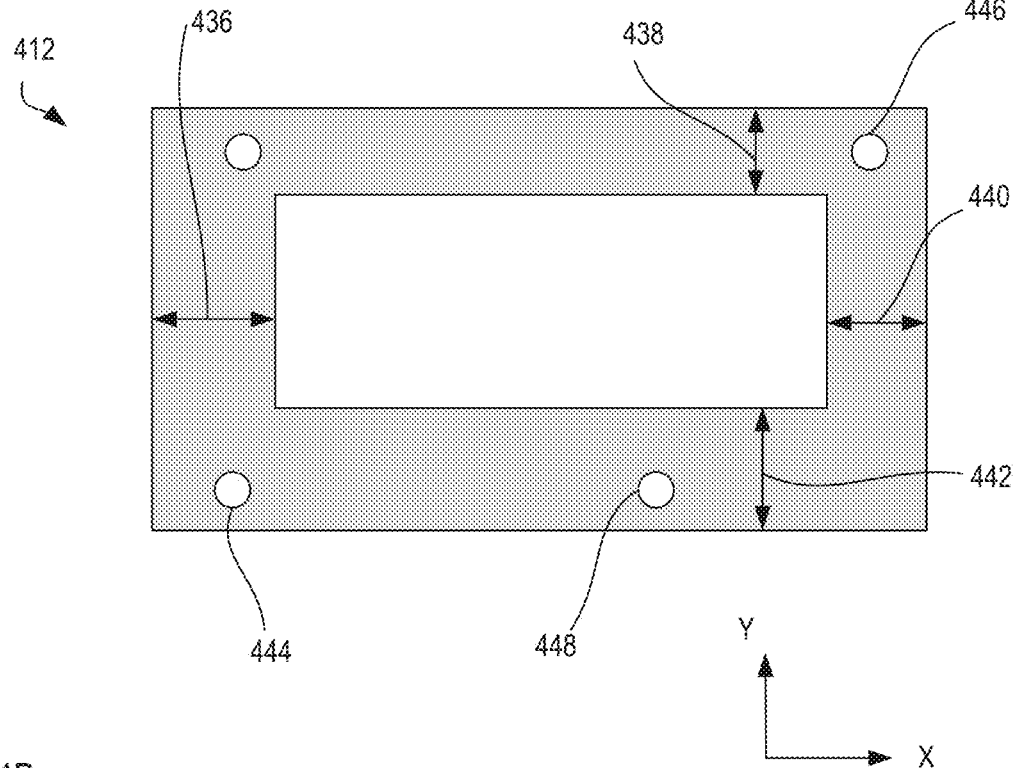

In a non-limiting example, the structure 412 has a thickness of 0.50 millimeters, a width of 6 millimeters and an overall weight of 4.78 grams. However, when viewed from a top-down perspective, the structure 412 may have a variable width as it encircles a package substrate; this is illustrated in FIG. 4B. Note that structure 412 has width 436, width 438, width 440 and width 442, which are not necessarily equal to each other. Additionally, the locations of the spring-loaded fasteners may be variously located. For example, structure 412 shows spring-loaded fasteners 444 and 446 located substantially at respective corners, but spring-loaded fastener 448 located more medially. In various embodiments, the top side frame stiffener structure is made of stainless steel. Other materials that can be used for the top side frame stiffener structure include copper, a carbon/glass fiber reinforced composite, or ceramic.

Thus, various embodiments and features of the top side frame stiffener structure have been described. The top side frame stiffener structure can have a significant improvement on PCB deflections and the resulting solder joint reliability (SJR). Various experiments showed improvements in compression of over 25%. Additionally, the eigenmode, or frequency that a system with the PCB stack will vibrate at, is higher when the top side frame stiffener structure is added to the PCB stack. Employing embodiments of the top side frame stiffener structure enable the use of thinner PCB without compromising strength. In some embodiments, the top side frame stiffener structure can have a local cut-out for device or board components, such as, for a screw tower. The effect of a local cut-out is minor for the technical benefits provided.

Figure 5:
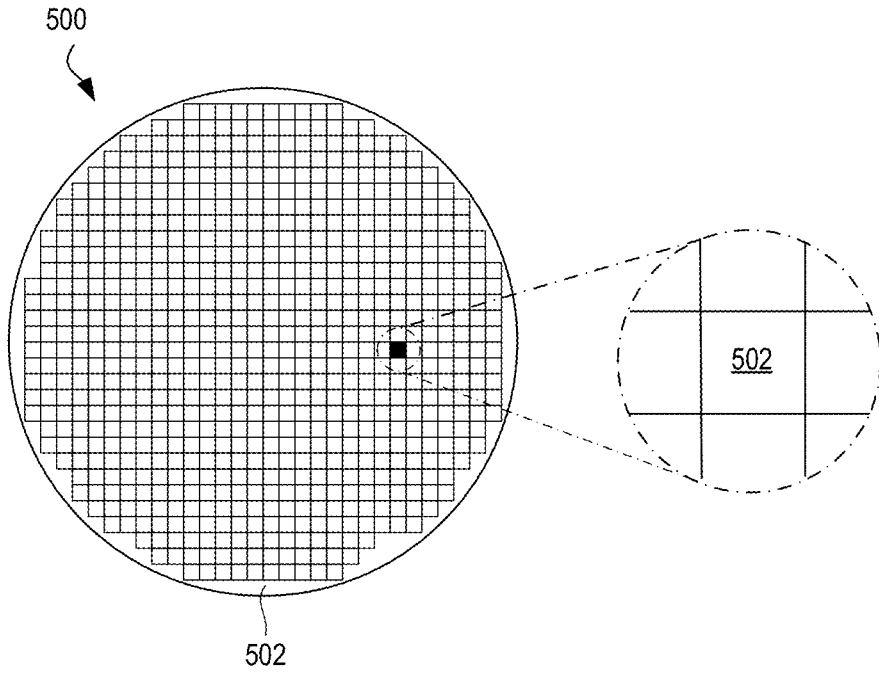
FIG. 5 is a top view of a wafer and dies that may embody integrated circuit components, in accordance with any of the embodiments disclosed herein.

FIG. 5 is a top view of a wafer 500 and dies 502 that may embody integrated circuit components, in accordance with any of the embodiments disclosed herein. The wafer 500 may be composed of semiconductor material and may include one or more dies 502 having integrated circuit structures formed on a surface of the wafer 500. The individual dies 502 may be a repeating unit of an integrated circuit product that includes any suitable integrated circuit. After the fabrication of the semiconductor product is complete, the wafer 500 may undergo a singulation process in which the dies 502 are separated from one another to provide discrete "chips" of the integrated circuit product. The die 502 may be any of the dies disclosed herein. The die 502 may include one or more transistors (e.g., some of the transistors 640 of FIG. 6, discussed below), supporting circuitry to route electrical signals to the transistors, passive components (e.g., signal traces, resistors, capacitors, or inductors), and/or any other integrated circuit components.

In some embodiments, the wafer 500 or the die 502 may include a memory device (e.g., a random access memory (RAM) device, such as a static RAM (SRAM) device, a magnetic RAM (MRAM) device, a resistive RAM (RRAM) device, a conductive-bridging RAM (CBRAM) device, etc.), a logic device (e.g., an AND, OR, NAND, or NOR gate), or any other suitable circuit element. Multiple ones of these devices may be combined on a single die 502. For example, a memory array formed by multiple memory devices may be formed on a same die 502 as a processor unit (e.g., the processor unit 802 of FIG. 8) or other logic that is configured to store information in the memory devices or execute instructions stored in the memory array. Various ones of the microelectronic assemblies 700 disclosed herein may be manufactured using a die-to-wafer assembly technique in which some dies 502 are attached to a wafer that include others of the dies 502, and the wafer is subsequently singulated.

Figure 6:
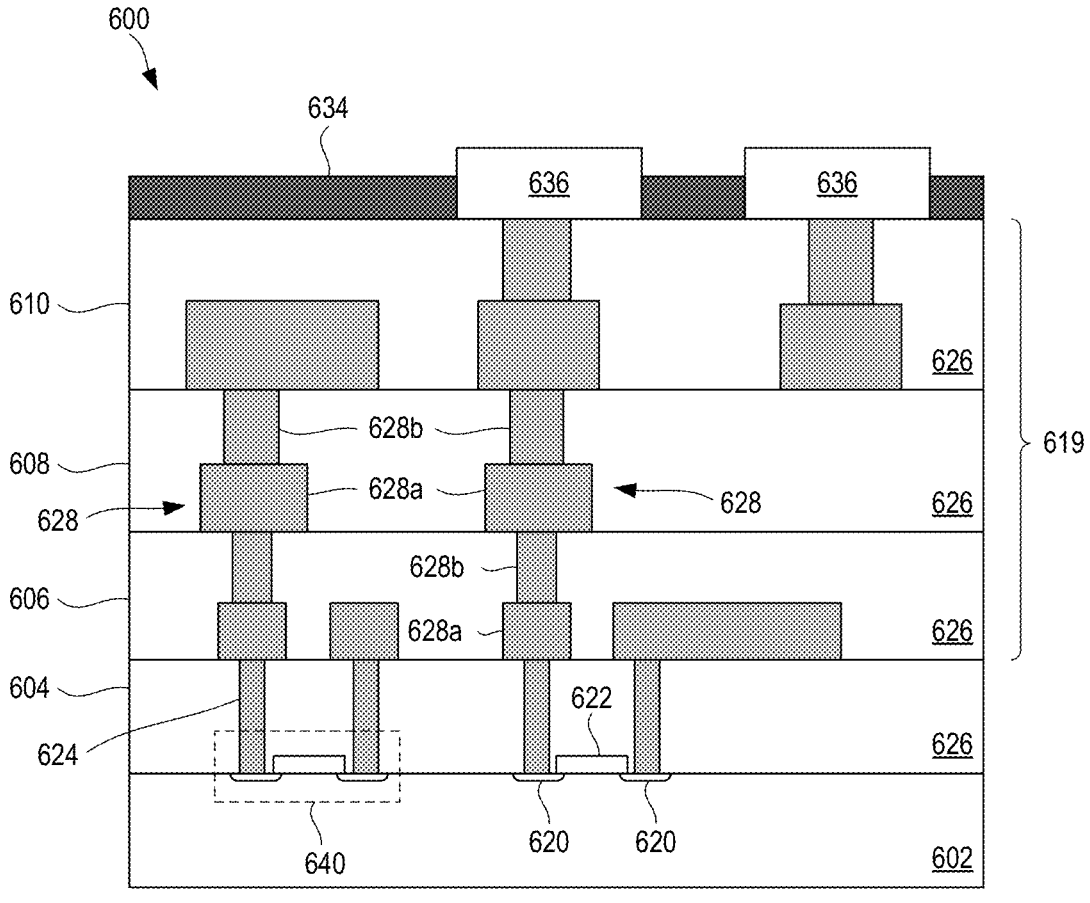
FIG. 6 is a simplified cross-sectional side view showing an implementation of an integrated circuit component on a die that may be included in any of the embodiments disclosed herein.

FIG. 6 is a cross-sectional side view of an integrated circuit component 600 implemented on a die that may be included in any of the embodiments disclosed herein. One or more of the integrated circuit components 600 may be included in one or more dies 502 (FIG. 5). The integrated circuit component 600 may be formed on a die substrate 602 (e.g., the wafer 500 of FIG. 5) and may be included in a die (e.g., the die 502 of FIG. 5). The die substrate 602 may be a semiconductor substrate composed of semiconductor material systems including, for example, n-type or p-type materials systems (or a combination of both). The die substrate 602 may include, for example, a crystalline substrate formed using a bulk silicon or a silicon-on-insulator (SOI) substructure. In some embodiments, the die substrate 602 may be formed using alternative materials, which may or may not be combined with silicon, that include, but are not limited to, germanium, indium antimonide, lead telluride, indium arsenide, indium phosphide, gallium arsenide, or gallium antimonide. Further materials classified as group II-VI, III-V, or IV may also be used to form the die substrate 602. Although a few examples of materials from which the die substrate 602 may be formed are described here, any material that may serve as a foundation for an integrated circuit component 600 may be used. The die substrate 602 may be part of a singulated die (e.g., the dies 502 of FIG. 5) or a wafer (e.g., the wafer 500 of FIG. 5).

The integrated circuit component 600 may include one or more device layers 604 disposed on the die substrate 602.

The device layer 604 may include features of one or more transistors 640 (e.g., metal oxide semiconductor field-effect transistors (MOSFETs)) formed on the die substrate 602. The transistors 640 may include, for example, one or more source and/or drain (S/D) regions 620, a gate 622 to control current flow between the S/D regions 620, and one or more S/D contacts 624 to route electrical signals to/from the S/D regions 620. The transistors 640 may include additional features not depicted for the sake of clarity, such as device isolation regions, gate contacts, and the like. The transistors 640 are not limited to the type and configuration depicted in FIG. 6 and may include a wide variety of other types and configurations such as, for example, planar transistors, non-planar transistors, or a combination of both. Non-planar transistors may include FinFET transistors, such as double-gate transistors or tri-gate transistors, and wrap-around or all-around gate transistors, such as nanoribbon, nanosheet, or nanowire transistors.

Continuing with FIG. 6, a transistor 640 may include a gate 622 formed of at least two layers, a gate dielectric and a gate electrode. The gate dielectric may include one layer or a stack of layers. The one or more layers may include silicon oxide, silicon dioxide, silicon carbide, and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric to improve its quality when a high-k material is used.

The gate electrode may be formed on the gate dielectric and may include at least one p-type work function metal or n-type work function metal, depending on whether the transistor 640 is to be a p-type metal oxide semiconductor (PMOS) or an n-type metal oxide semiconductor (NMOS) transistor. In some implementations, the gate electrode may consist of a stack of two or more metal layers, where one or more metal layers are work function metal layers and at least one metal layer is a fill metal layer. Further metal layers may be included for other purposes, such as a barrier layer.

For a PMOS transistor, metals that may be used for the gate electrode include, but are not limited to, ruthenium, palladium, platinum, cobalt, nickel, conductive metal oxides (e.g., ruthenium oxide), and any of the metals discussed below with reference to an NMOS transistor (e.g., for work function tuning). For an NMOS transistor, metals that may be used for the gate electrode include, but are not limited to, hafnium, zirconium, titanium, tantalum, aluminum, alloys of these metals, carbides of these metals (e.g., hafnium carbide, zirconium carbide, titanium carbide, tantalum carbide, and aluminum carbide), and any of the metals discussed above with reference to a PMOS transistor (e.g., for work function tuning).

In some embodiments, when viewed as a cross-section of the transistor 640 along the source-channel-drain direction, the gate electrode may consist of a U-shaped structure that includes a bottom portion substantially parallel to the surface of the die substrate 602 and two sidewall portions that are substantially perpendicular to the top surface of the die substrate 602. In other embodiments, at least one of the metal layers that form the gate electrode may simply be a planar layer that is substantially parallel to the top surface of the die substrate 602 and does not include sidewall portions substantially perpendicular to the top surface of the die substrate 602. In other embodiments, the gate electrode may consist of a combination of U-shaped structures and planar, non-U-shaped structures. For example, the gate electrode may consist of one or more U-shaped metal layers formed atop one or more planar, non-U-shaped layers.

In some embodiments, a pair of sidewall spacers may be formed on opposing sides of the gate stack to bracket the gate stack. The sidewall spacers may be formed from materials such as silicon nitride, silicon oxide, silicon carbide, silicon nitride doped with carbon, and silicon oxynitride. Processes for forming sidewall spacers are well known in the art and generally include deposition and etching process steps. In some embodiments, a plurality of spacer pairs may be used; for instance, two pairs, three pairs, or four pairs of sidewall spacers may be formed on opposing sides of the gate stack.

The S/D regions 620 may be formed within the die substrate 602 adjacent to the gate 622 of individual transistors 640. The S/D regions 620 may be formed using an implantation/diffusion process or an etching/deposition process, for example. In the former process, dopants such as boron, aluminum, antimony, phosphorous, or arsenic may be ion-implanted into the die substrate 602 to form the S/D regions 620. An annealing process that activates the dopants and causes them to diffuse farther into the die substrate 602 may follow the ion-implantation process. In the latter process, the die substrate 602 may first be etched to form recesses at the locations of the S/D regions 620. An epitaxial deposition process may then be carried out to fill the recesses with material that is used to fabricate the S/D regions 620. In some implementations, the S/D regions 620 may be fabricated using a silicon alloy such as silicon germanium or silicon carbide. In some embodiments, the epitaxially deposited silicon alloy may be doped in situ with dopants such as boron, arsenic, or phosphorous. In some embodiments, the S/D regions 620 may be formed using one or more alternate semiconductor materials such as germanium or a group III-V material or alloy. In further embodiments, one or more layers of metal and/or metal alloys may be used to form the S/D regions 620.

Electrical signals, such as power and/or input/output (I/O) signals, may be routed to and/or from the devices (e.g., transistors 640) of the device layer 604 through one or more interconnect layers disposed on the device layer 604 (illustrated in FIG. 6 as interconnect layers 606-610). For example, electrically conductive features of the device layer 604 (e.g., the gate 622 and the S/D contacts 624) may be electrically coupled with the interconnect structures 628 of the interconnect layers 606-610. The one or more interconnect layers 606-610 may form a metallization stack (also referred to as an "ILD stack") 619 of the integrated circuit component 600.

The interconnect structures 628 may be arranged within the interconnect layers 606-610 to route electrical signals according to a wide variety of designs; in particular, the arrangement is not limited to the particular configuration of interconnect structures 628 depicted in FIG. 6. Although a particular number of interconnect layers 606-610 is depicted in FIG. 6, embodiments of the present disclosure include integrated circuit components having more or fewer interconnect layers than depicted.

In some embodiments, the interconnect structures 628 may include lines 628a and/or vias 628b filled with an electrically conductive material such as a metal. The lines 628a may be arranged to route electrical signals in a direction of a plane that is substantially parallel with a surface of the die substrate 602 upon which the device layer 604 is formed. For example, the lines 628a may route electrical signals in a direction in and out of the page and/or in a direction across the page. The vias 628b may be arranged to route electrical signals in a direction of a plane that is substantially perpendicular to the surface of the die substrate 602 upon which the device layer 604 is formed. In some embodiments, the vias 628b may electrically couple lines 628a of different interconnect layers 606-610 together.

The interconnect layers 606-610 may include a dielectric material 626 disposed between the interconnect structures 628, as shown in FIG. 6. In some embodiments, dielectric material 626 disposed between the interconnect structures 628 in different ones of the interconnect layers 606-610 may have different compositions; in other embodiments, the composition of the dielectric material 626 between different interconnect layers 606-610 may be the same. The device layer 604 may include a dielectric material 626 disposed between the transistors 640 and a bottom layer of the metallization stack as well. The dielectric material 626 included in the device layer 604 may have a different composition than the dielectric material 626 included in the interconnect layers 606-610; in other embodiments, the composition of the dielectric material 626 in the device layer 604 may be the same as a dielectric material 626 included in any one of the interconnect layers 606-610.

A first interconnect layer 606 (referred to as Metal 1 or "M1") may be formed directly on the device layer 604. In some embodiments, the first interconnect layer 606 may include lines 628a and/or vias 628b, as shown. The lines 628a of the first interconnect layer 606 may be coupled with contacts (e.g., the S/D contacts 624) of the device layer 604. The vias 628b of the first interconnect layer 606 may be coupled with the lines 628a of a second interconnect layer 608.

The second interconnect layer 608 (referred to as Metal 2 or "M2") may be formed directly on the first interconnect layer 606. In some embodiments, the second interconnect layer 608 may include via 628b to couple the lines 628 of the second interconnect layer 608 with the lines 628a of a third interconnect layer 610. Although the lines 628a and the vias 628b are structurally delineated with a line within individual interconnect layers for the sake of clarity, the lines 628a and the vias 628b may be structurally and/or materially contiguous (e.g., simultaneously filled during a dual-damascene process) in some embodiments.

The third interconnect layer 610 (referred to as Metal 3 or "M3") (and additional interconnect layers, as desired) may be formed in succession on the second interconnect layer 608 according to similar techniques and configurations described in connection with the second interconnect layer 608 or the first interconnect layer 606. In some embodiments, the interconnect layers that are "higher up" in the metallization stack 619 in the integrated circuit component 600 (i.e., farther away from the device layer 604) may be thicker than the interconnect layers that are lower in the metallization stack 619, with lines 628a and vias 628b in the higher interconnect layers being thicker than those in the lower interconnect layers.

The integrated circuit component 600 may include a solder resist material 634 (e.g., polyimide or similar material) and one or more conductive contacts 636 formed on the interconnect layers 606-610. In FIG. 6, the conductive contacts 636 are illustrated as taking the form of bond pads.

The conductive contacts 636 may be electrically coupled with the interconnect structures 628 and configured to route the electrical signals of the transistor(s) 640 to external devices. For example, solder bonds may be formed on the one or more conductive contacts 636 to mechanically and/or electrically couple an integrated circuit die including the integrated circuit component 600 with another component (e.g., a printed circuit board). The integrated circuit component 600 may include additional or alternate structures to route the electrical signals from the interconnect layers 606-610; for example, the conductive contacts 636 may include other analogous features (e.g., posts) that route the electrical signals to external components.

In some embodiments in which the integrated circuit component 600 is double-sided, the integrated circuit component 600 may include another metallization stack (not shown) on the opposite side of the device layer(s) 604. This metallization stack may include multiple interconnect layers as discussed above with reference to the interconnect layers 606-610, to provide conductive pathways (e.g., including conductive lines and vias) between the device layer(s) 604 and additional conductive contacts (not shown) on the opposite side of the integrated circuit component 600 from the conductive contacts 636.

In other embodiments in which the integrated circuit component 600 is double-sided, the integrated circuit component 600 may include one or more through silicon vias (TSVs) through the die substrate 602; these TSVs may make contact with the device layer(s) 604, and may provide conductive pathways between the device layer(s) 604 and additional conductive contacts (not shown) on the opposite side of the integrated circuit component 600 from the conductive contacts 636. In some embodiments, TSVs extending through the substrate can be used for routing power and ground signals from conductive contacts on the opposite side of the integrated circuit component 600 from the conductive contacts 636 to the transistors 640 and any other components integrated into the integrated circuit component 600, and the metallization stack 619 can be used to route I/O signals from the conductive contacts 636 to transistors 640 and any other components integrated into the integrated circuit component 600.

Multiple integrated circuit components 600 may be stacked with one or more TSVs in the individual stacked devices providing connection between one of the devices to any of the other devices in the stack. For example, one or more high-bandwidth memory (HBM) integrated circuit dies can be stacked on top of a base integrated circuit die and TSVs in the HBM dies can provide connection between the individual HBM and the base integrated circuit die. Conductive contacts can provide additional connections between adjacent integrated circuit dies in the stack. In some embodiments, the conductive contacts can be fine-pitch solder bumps (microbumps).

Figure 7:
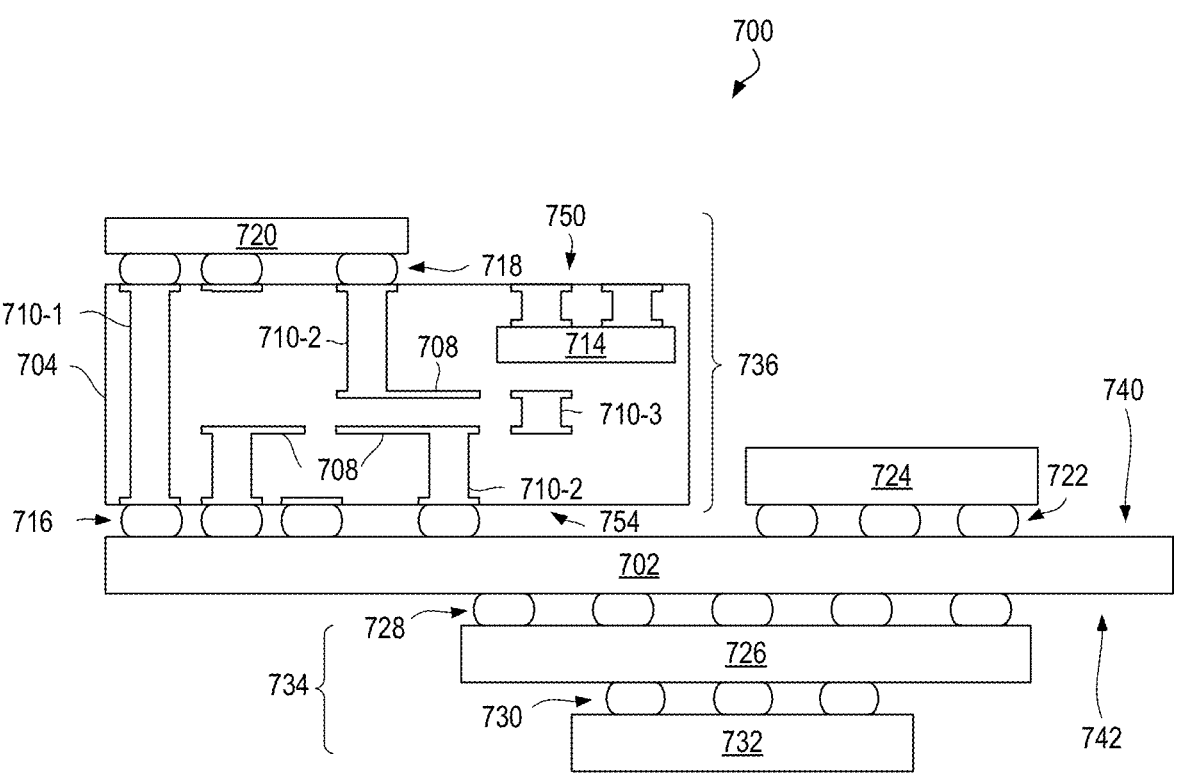
FIG. 7 is a cross-sectional side view of a microelectronic assembly that may include any of the embodiments disclosed herein.

FIG. 7 is a cross-sectional side view of a microelectronics assembly 700 that may include an apparatus or structure disclosed herein. The microelectronics assembly 700 includes a number of components disposed on a circuit board 702 (which may be a motherboard, system board, mainboard, etc.). The microelectronics assembly 700 includes components disposed on a first face 740 of the circuit board 702 and an opposing second face 742 of the circuit board 702; generally, components may be disposed on one or both faces 740 and 742.

In some embodiments, the circuit board 702 may be a printed circuit board (PCB) including multiple metal (or interconnect) layers separated from one another by layers of dielectric material and interconnected by electrically conductive vias. The individual metal layers comprise conductive traces. Any one or more of the metal layers may be formed in a desired circuit pattern to route electrical signals (optionally in conjunction with other metal layers) between the components coupled to the circuit board 702. In other embodiments, the circuit board 702 may be a non-PCB substrate. In some embodiments the circuit board 702 may be, for example, the PCB 110. The microelectronics assembly 700 illustrated in FIG. 7 includes a package-on-interposer structure 736 coupled to the first face 740 of the circuit board 702 by coupling components 716. The coupling components 716 may electrically and mechanically couple the package-on-interposer structure 736 to the circuit board 702, and may include solder balls (as shown in FIG. 7), pins (e.g., as part of a pin grid array (PGA)), contacts (e.g., as part of a land grid array (LGA)), male and female portions of a socket, an adhesive, an underfill material, and/or any other suitable electrical and/or mechanical coupling structure. The coupling components 716 may serve as the coupling components illustrated or described for any of the substrate assembly or substrate assembly components described herein, as appropriate.

The package-on-interposer structure 736 may include an integrated circuit component 720 coupled to an interposer 704 by coupling components 718. The coupling components 718 may take any suitable form for the application, such as the forms discussed above with reference to the coupling components 716. Although a single integrated circuit component 720 is shown in FIG. 7, multiple integrated circuit components may be coupled to the interposer 704; indeed, additional interposers may be coupled to the interposer 704. The interposer 704 may provide an intervening substrate used to bridge the circuit board 702 and the integrated circuit component 720.

The integrated circuit component 720 may be a packaged or unpacked integrated circuit product that includes one or more integrated circuit dies (e.g., the die 502 of FIG. 5, the integrated circuit component 600 of FIG. 6) and/or one or more other suitable components. A packaged integrated circuit component comprises one or more integrated circuit dies mounted on a package substrate with the integrated circuit dies and package substrate encapsulated in a casing material, such as a metal, plastic, glass, or ceramic. In one example of an unpackaged integrated circuit component 720, a single monolithic integrated circuit die comprises solder bumps attached to contacts on the die. The solder bumps allow the die to be directly attached to the interposer 704. The integrated circuit component 720 can comprise one or more computing system components, such as one or more processor units (e.g., system-on-a-chip (SoC), processor core, graphics processor unit (GPU), accelerator, chipset processor), I/O controller, memory, or network interface controller. In some embodiments, the integrated circuit component 720 can comprise one or more additional active or passive devices such as capacitors, decoupling capacitors, resistors, inductors, fuses, diodes, transformers, sensors, electrostatic discharge (ESD) devices, and memory devices.

In embodiments where the integrated circuit component 720 comprises multiple integrated circuit dies, the dies can be of the same type (a homogeneous multi-die integrated circuit component) or of two or more different types (a heterogeneous multi-die integrated circuit component). A multi-die integrated circuit component can be referred to as a multi-chip package (MCP) or multi-chip module (MCM).

In addition to comprising one or more processor units, the integrated circuit component 720 can comprise additional components, such as embedded DRAM, stacked high bandwidth memory (HBM), shared cache memories, input/output (I/O) controllers, or memory controllers. Any of these additional components can be located on the same integrated circuit die as a processor unit, or on one or more integrated circuit dies separate from the integrated circuit dies comprising the processor units. These separate integrated circuit dies can be referred to as "chiplets". In embodiments where an integrated circuit component comprises multiple integrated circuit dies, interconnections between dies can be provided by the package substrate, one or more silicon interposers, one or more silicon bridges embedded in the package substrate (such as Intel® embedded multi-die interconnect bridges (EMIBs)), or combinations thereof.

Generally, the interposer 704 may spread connections to a wider pitch or reroute a connection to a different connection. For example, the interposer 704 may couple the integrated circuit component 720 to a set of ball grid array (BGA) conductive contacts of the coupling components 716 for coupling to the circuit board 702. In the embodiment illustrated in FIG. 7, the integrated circuit component 720 and the circuit board 702 are attached to opposing sides of the interposer 704; in other embodiments, the integrated circuit component 720 and the circuit board 702 may be attached to a same side of the interposer 704. In some embodiments, three or more components may be interconnected by way of the interposer 704.

In some embodiments, the interposer 704 may be formed as a PCB, including multiple metal layers separated from one another by layers of dielectric material and interconnected by electrically conductive vias. In some embodiments, the interposer 704 may be formed of an epoxy resin, a fiberglass-reinforced epoxy resin, an epoxy resin with inorganic fillers, a ceramic material, or a polymer material such as polyimide. In some embodiments, the interposer 704 may be formed of alternate rigid or flexible materials that may include the same materials described above for use in a semiconductor substrate, such as silicon, germanium, and other group III-V and group IV materials. The interposer 704 may include metal interconnects 708 and vias 710, including but not limited to through hole vias 710-1 (that extend from a first face 750 of the interposer 704 to a second face 754 of the interposer 704), blind vias 710-2 (that extend from the first or second faces 750 or 754 of the interposer 704 to an internal metal layer), and buried vias 710-3 (that connect internal metal layers).

In some embodiments, the interposer 704 can comprise a silicon interposer. Through silicon vias (TSV) extending through the silicon interposer can connect connections on a first face of a silicon interposer to an opposing second face of the silicon interposer. In some embodiments, an interposer 704 comprising a silicon interposer can further comprise one or more routing layers to route connections on a first face of the interposer 704 to an opposing second face of the interposer 704.

The interposer 704 may further include embedded devices 714, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency devices, power amplifiers, power management devices, antennas, arrays, sensors, and microelectromechanical systems (MEMS) devices may also be formed on the interposer 704. The package-on-interposer structure 736 may take the form of any of the package-on-interposer structures known in the art.

The microelectronics assembly 700 may include an integrated circuit component 724 coupled to the first face 740 of the circuit board 702 by coupling components 722. The coupling components 722 may take the form of any of the embodiments discussed above with reference to the coupling components 716, and the integrated circuit component 724 may take the form of any of the embodiments discussed above with reference to the integrated circuit component 720.

The microelectronics assembly 700 illustrated in FIG. 7 includes a package-on-package structure 734 coupled to the second face 742 of the circuit board 702 by coupling components 728. The package-on-package structure 734 may include an integrated circuit component 726 and an integrated circuit component 732 coupled together by coupling components 730 such that the integrated circuit component 726 is disposed between the circuit board 702 and the integrated circuit component 732. The coupling components 728 and 730 may take the form of any of the embodiments of the coupling components 716 discussed above, and the integrated circuit components 726 and 732 may take the form of any of the embodiments of the integrated circuit component 720 discussed above. The package-on-package structure 734 may be configured in accordance with any of the package-on-package structures known in the art.

Figure 8:
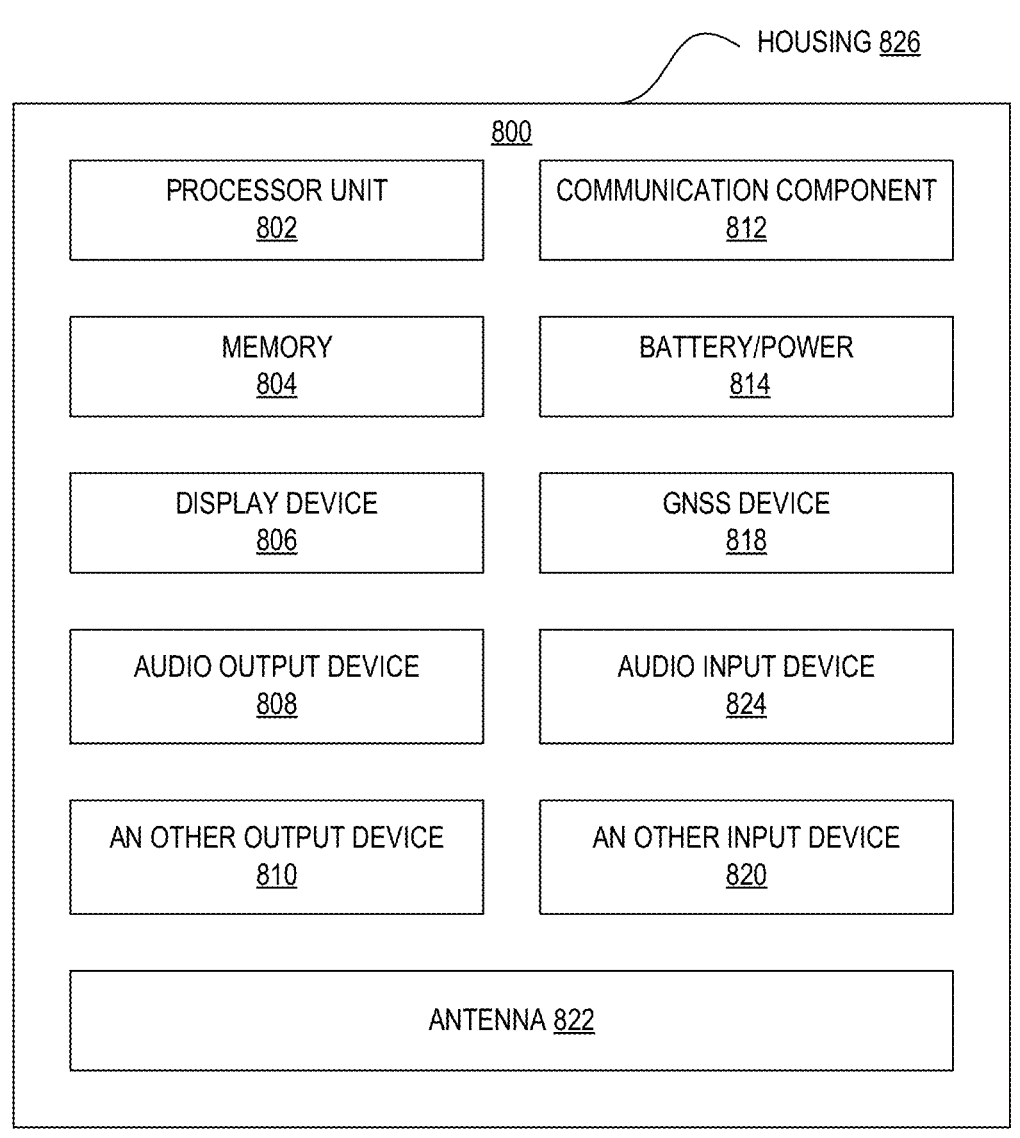
FIG. 8 is a block diagram of an example electrical device that may include any of the embodiments disclosed herein.

FIG. 8 is a block diagram of an example electrical device 800 that may include an apparatus and/or structure disclosed herein. For example, any suitable ones of the components of the electrical device 800 may include one or more of the apparatus (e.g., 100, 130), structures (e.g., 208, 214, 216), microelectronic assemblies 700, integrated circuit components, or integrated circuit dies 502 disclosed herein. A number of components are illustrated in FIG. 8 as included in the electrical device 800, but any one or more of these components may be omitted or duplicated, as suitable for the application. In some embodiments, some or all of the components included in the electrical device 800 may be attached to one or more motherboards mainboards, or system boards. In some embodiments, one or more of these components are fabricated onto a single system-on-a-chip (SoC) die. In some embodiments, some or all of the components included in the electrical device 800 may be enclosed in a housing 826.

Additionally, in various embodiments, the electrical device 800 may not include one or more of the components illustrated in FIG. 8, but the electrical device 800 may include interface circuitry for coupling to the one or more components. For example, the electrical device 800 may not include a display device 806, but may include display device interface circuitry (e.g., a connector and driver circuitry) to which a display device 806 may be coupled. In another set of examples, the electrical device 800 may not include an audio input device 824 or an audio output device 808, but may include audio input or output device interface circuitry (e.g., connectors and supporting circuitry) to which an audio input device 824 or audio output device 808 may be coupled.

The electrical device 800 may include one or more processor units 802, as defined herein. The electrical device 800 may include a memory 804, which may itself include one or more memory devices such as volatile memory (e.g., dynamic random access memory (DRAM), static random-access memory (SRAM)), non-volatile memory (e.g., read-only memory (ROM), flash memory, chalcogenide-based phase-change non-volatile memories), solid state memory, and/or a hard drive. In some embodiments, the memory 804 may include memory that is located on the same integrated circuit die as the processor unit 802. This memory may be used as cache memory (e.g., Level 1 (L1), Level 2 (L2), Level 3 (L3), Level 4 (L4), Last Level Cache (LLC)) and may include embedded dynamic random-access memory (eDRAM) or spin transfer torque magnetic random-access memory (STT-MRAM).

In some embodiments, the electrical device 800 can comprise one or more processor units 802 that are heterogeneous or asymmetric to another processor unit 802 in the electrical device 800. There can be a variety of differences between the processing units 802 in a system in terms of a spectrum of metrics of merit including architectural, micro-architectural, thermal, power consumption characteristics, and the like. These differences can effectively manifest themselves as asymmetry and heterogeneity among the processor units 802 in the electrical device 800.

In some embodiments, the electrical device 800 may include a communication component 812 (e.g., one or more communication components). For example, the communication component 812 can manage wireless communications for the transfer of data to and from the electrical device 800. The term "wireless" and its derivatives may be used to describe circuits, devices, systems, methods, techniques, communications channels, etc., that may communicate data through the use of modulated electromagnetic radiation through a nonsolid medium. The term "wireless" does not imply that the associated devices do not contain any wires, although in some embodiments they might not.

The communication component 812 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra-mobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication component 812 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication component 812 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication component 812 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. The communication component 812 may operate in accordance with other wireless protocols in other embodiments. The electrical device 800 may include an antenna 822 to facilitate wireless communications and/or to receive other wireless communications (such as AM or FM radio transmissions).

In some embodiments, the communication component 812 may manage wired communications, such as electrical, optical, or any other suitable communication protocols (e.g., IEEE 802.3 Ethernet standards). As noted above, the communication component 812 may include multiple communication components. For instance, a first communication component 812 may be dedicated to shorter-range wireless communications such as Wi-Fi or Bluetooth, and a second communication component 812 may be dedicated to longer-range wireless communications such as global positioning system (GPS), EDGE, GPRS, CDMA, WiMAX, LTE, EV-DO, or others. In some embodiments, a first communication component 812 may be dedicated to wireless communications, and a second communication component 812 may be dedicated to wired communications.

The electrical device 800 may include battery/power circuitry 814. The battery/power circuitry 814 may include one or more energy storage devices (e.g., batteries or capacitors) and/or circuitry for coupling components of the electrical device 800 to an energy source separate from the electrical device 800 (e.g., AC line power).

The electrical device 800 may include a display device 806 (or corresponding interface circuitry, as discussed above). The display device 806 may include one or more embedded or wired or wirelessly connected external visual indicators, such as a heads-up display, a computer monitor, a projector, a touchscreen display, a liquid crystal display (LCD), a light-emitting diode display, or a flat panel display.

The electrical device 800 may include an audio output device 808 (or corresponding interface circuitry, as discussed above). The audio output device 808 may include any embedded or wired or wirelessly connected external device that generates an audible indicator, such as speakers, headsets, or earbuds.

The electrical device 800 may include an audio input device 824 (or corresponding interface circuitry, as discussed above). The audio input device 824 may include any embedded or wired or wirelessly connected device that generates a signal representative of a sound, such as microphones, microphone arrays, or digital instruments (e.g., instruments having a musical instrument digital interface (MIDI) output). The electrical device 800 may include a Global Navigation Satellite System (GNSS) device 818 (or corresponding interface circuitry, as discussed above), such as a Global Positioning System (GPS) device. The GNSS device 818 may be in communication with a satellite-based system and may determine a geolocation of the electrical device 800 based on information received from one or more GNSS satellites, as known in the art.

The electrical device 800 may include another output device 810 (or corresponding interface circuitry, as discussed above). Examples of the other output device 810 may include an audio codec, a video codec, a printer, a wired or wireless transmitter for providing information to other devices, or an additional storage device.

The electrical device 800 may include another input device 820 (or corresponding interface circuitry, as discussed above). Examples of the other input device 820 may include an accelerometer, a gyroscope, a compass, an image capture device (e.g., monoscopic or stereoscopic camera), a trackball, a trackpad, a touchpad, a keyboard, a cursor control device such as a mouse, a stylus, a touchscreen, proximity sensor, microphone, a bar code reader, a Quick Response (QR) code reader, electrocardiogram (ECG) sensor, PPG (photoplethysmogram) sensor, galvanic skin response sensor, any other sensor, or a radio frequency identification (RFID) reader.

The electrical device 800 may have any desired form factor, such as a hand-held or mobile electrical device (e.g., a cell phone, a smart phone, a mobile internet device, a music player, a tablet computer, a laptop computer, a 2-in-1 convertible computer, a portable all-in-one computer, a netbook computer, an ultrabook computer, a personal digital assistant (PDA), an ultra-mobile personal computer, a portable gaming console, etc.), a desktop electrical device, a server, a rack-level computing solution (e.g., blade, tray or sled computing systems), a workstation or other networked computing component, a printer, a scanner, a monitor, a set-top box, an entertainment control unit, a stationary gaming console, smart television, a vehicle control unit, a digital camera, a digital video recorder, a wearable electrical device or an embedded computing system (e.g., computing systems that are part of a vehicle, smart home appliance, consumer electronics product or equipment, manufacturing equipment). In some embodiments, the electrical device 800 may be any other electronic device that processes data. In some embodiments, the electrical device 800 may comprise multiple discrete physical components. Given the range of devices that the electrical device 800 can be manifested as in various embodiments, in some embodiments, the electrical device 800 can be referred to as a computing device or a computing system.

As used in this application and the claims, a list of items joined by the term "at least one of" can mean any combination of the listed terms. For example, the phrase "at least one of A, B and C" can mean A; B; C; A and B; A and C; B and C; or A, B, and C. Similarly, as used in this application and the claims, a list of items joined by the term "one or more of" can mean any combination of the listed terms. For example, the phrase "one or more of A, B and C" can mean A; B; C; A and B; A and C; B and C; or A, B, and C.

The disclosed methods, apparatuses, and systems are not to be construed as limiting in any way. Instead, the present disclosure is directed toward all novel and nonobvious features and aspects of the various disclosed embodiments, alone and in various combinations and sub-combinations with one another. The disclosed methods, apparatuses, and systems are not limited to any specific aspect or feature or combination thereof, nor do the disclosed embodiments require that any one or more specific advantages be present, or problems be solved.

Theories of operation, scientific principles, or other theoretical descriptions presented herein in reference to the apparatuses or methods of this disclosure have been provided for the purposes of better understanding and are not intended to be limiting in scope. The apparatuses and methods in the appended claims are not limited to those apparatuses and methods that function in the manner described by such theories of operation.

The following examples pertain to additional embodiments of technologies disclosed herein.

EXAMPLES

Example 1 is an apparatus, comprising: a backing plate (BP); a printed circuit board (PCB) located on the BP; a package substrate comprising a die attached to the PCB; a cooling component located over the package substrate and attached to the BP; and a structure located in between the PCB and cooling component, the structure external to a periphery of the package substrate.

Example 2 includes the subject matter of Example 1, wherein the structure comprises stainless steel.

Example 3 includes the subject matter of Example 1, wherein the cooling component comprises a vapor chamber.

Example 4 includes the subject matter of Example 1, further comprising a standoff, and wherein: the standoff has a first end and a second end; the standoff is attached at the first end to the BP; and the cooling component is attached to the standoff at a second end.

Example 5 includes the subject matter of any one of Examples 1-4, further comprising a fastener means that is adjustable to secure the cooling component on the standoff.

Example 6 includes the subject matter of Example 5, further comprising a spring element coiled around a part of the fastener means and located above the cooling component.

Example 7 includes the subject matter of any one of Examples 4-6, wherein the structure comprises an opening that is positioned over the second end and located under the cooling component.

Example 8 includes the subject matter of any one of Examples 1-7, wherein the die comprises a central processing unit (CPU) or graphics processing unit (GPU).

Example 9 includes the subject matter of any one of Examples 1-7, wherein the structure comprises a bend toward the BP.

Example 10 includes the subject matter of Example 1, further comprising a standoff, and wherein: the standoff has a first end and a second end; the standoff is attached at the first end to the BP; and the second end of the standoff comprises a threaded opening therein.

Example 11 includes the subject matter of Example 10, further comprising a screw having a region that is threaded, and wherein the cooling component is attached to the standoff with the screw in the threaded opening.

Example 12 includes the subject matter of Example 11, further comprising a spring element coiled around a part of the screw and located above the cooling component.

Example 13 includes the subject matter of any one of Examples 10-12, wherein the structure comprises stainless steel.

Example 14 includes the subject matter of any one of Examples 10-13, wherein the cooling component comprises a vapor chamber.

Example 15 is a device, comprising: a backing plate (BP); a printed circuit board (PCB) located on the BP; a package substrate comprising a die attached to the PCB; a cooling component located over the package substrate and attached to the BP; and a structure located in between the PCB and cooling component, the structure external to a periphery of the package substrate.

Example 16 includes the subject matter of Example 15, wherein the die comprises a central processing unit (CPU) or graphics processing unit (GPU).

Example 17 includes the subject matter of Example 15, wherein the structure comprises stainless steel.

Example 18 includes the subject matter of Example 15, wherein the cooling component comprises a vapor chamber.

Example 19 includes the subject matter of Example 15, further comprising a standoff, and wherein: the standoff has a first end and a second end; the standoff is attached at the first end to the BP; and the cooling component is attached to the standoff at a second end.

Example 20 includes the subject matter of any one of Examples 15-19, further comprising a fastener means that is adjustable to secure the cooling component on the standoff.

Example 21 includes the subject matter of Example 20, further comprising a spring element coiled around a part of the fastener means and located above the cooling component.

Example 22 includes the subject matter of any one of Examples 19-21, wherein the structure comprises an opening that is positioned over the second end and located under the cooling component.

Example 23 includes the subject matter of any one of Examples 15-22, wherein the structure comprises a bend toward the BP.

Example 24 includes the subject matter of Example 15, further comprising a standoff, and wherein: the standoff has a first end and a second end; the standoff is attached at the first end to the BP; and the second end of the standoff comprises a threaded opening therein.

Example 25 includes the subject matter of Example 24, further comprising a screw having a region that is threaded, and wherein the cooling component is attached to the standoff with the screw in the threaded opening.

Example 26 includes the subject matter of Example 25, further comprising a spring element coiled around a part of the screw and located above the cooling component.

Example 27 includes the subject matter of any one of Examples 24-26, wherein the structure comprises stainless steel.

Example 28 includes the subject matter of any one of Examples 24-27, wherein the cooling component comprises a vapor chamber.

What is claimed is:

1. An apparatus, comprising:
a backing plate (BP);
a printed circuit board (PCB) located on the BP;
a package substrate comprising a die attached to the PCB;
a cooling component located over the package substrate and attached to the BP;
a structure located in between the PCB and the cooling component, the structure external to a periphery of the package substrate; and
a standoff comprising a first end and a second end, wherein the standoff is attached at the first end to the BP and the cooling component is attached to the standoff at the second end.

2. The apparatus of claim 1, wherein the structure comprises stainless steel.

3. The apparatus of claim 1, wherein the cooling component comprises a vapor chamber.

4. The apparatus of claim 1, further comprising a fastener means that is adjustable to secure the cooling component to the standoff.

5. The apparatus of claim 4, further comprising a spring element coiled around a part of the fastener means and located above the cooling component.

6. The apparatus of claim 1, wherein the structure comprises an opening that is positioned over the second end and located under the cooling component.

7. The apparatus of claim 1, wherein the die comprises a central processing unit (CPU) or graphics processing unit (GPU).

8. The apparatus of claim 1, wherein the structure comprises a bend toward the BP.

9. An apparatus, comprising:
a backing plate (BP);
a printed circuit board (PCB) located on the BP;
a package substrate comprising a die attached to the PCB;

a cooling component located over the package substrate and attached to the BP;

a structure located in between the PCB and the cooling component, the structure external to a periphery of the package substrate; and a standoff comprising a first end and a second end, wherein the standoff is attached at the first end to the BP and the second end of the standoff comprises a threaded opening therein.

10. The apparatus of claim 9, further comprising a screw having a region that is threaded, and wherein the cooling component is attached to the standoff with the screw in the threaded opening.

11. The apparatus of claim 10, further comprising a spring element coiled around a part of the screw and located above the cooling component.

12. The apparatus of claim 9, wherein the structure comprises stainless steel.

13. The apparatus of claim 9, wherein the cooling component comprises a vapor chamber.

14. The apparatus of claim 9, wherein the die comprises a central processing unit (CPU) or graphics processing unit (GPU).

15. The apparatus of claim 9, wherein the structure comprises stainless steel.

16. The apparatus of claim 9, wherein the cooling component comprises a vapor chamber.

17. An apparatus, comprising:

a backing plate;

a printed circuit board attached to the backing plate;

a package substrate attached to the printed circuit board, wherein the printed circuit board is located between the backing plate and the package substrate;

a die attached to the package substrate;

a cooling component located over the die;

a frame located between the printed circuit board and the cooling component, wherein the frame defines an opening extending through the frame, the package substrate is positioned within the opening, and the frame is laterally outward of a periphery of the package substrate;

a standoff extending from the backing plate, the standoff comprising a threaded opening; and a screw received in the threaded opening, the screw comprising:

a first region at a distal end of the screw, the first region having a first diameter and external threads engaged with the threaded opening of the standoff;

a second region spaced from the distal end, the second region having a second diameter greater than the first diameter; and a transition region between the first region and the second region, the transition region defining a shoulder.

18. The apparatus of claim 17, wherein the opening is a first opening, the frame comprises a second opening aligned with the threaded opening of the standoff, the second opening having a diameter that is greater than the first diameter and less than the second diameter, such that the shoulder is axially engaged with the frame.

19. The apparatus of claim 17, wherein the cooling component comprises an opening aligned with the threaded opening of the standoff, the opening having a diameter greater than the second diameter such that a portion of the second region of the screw extends through the opening.

20. The apparatus of claim 17, further comprising a coil spring disposed coaxially around the second region of the screw, wherein the coil spring is positioned between a head of the screw and the cooling component to apply a compressive spring force upon tightening of the screw.

21. The apparatus of claim 20, wherein the coil spring has an outer diameter greater than a diameter of an opening of the cooling component.

22. The apparatus of claim 17, wherein the frame comprises a first portion in a first plane and a second portion in a second plane different from the first plane.

23. The apparatus of claim 17, wherein the die comprises a central processing unit (CPU) or graphics processing unit (GPU).

24. The apparatus of claim 17, wherein the frame comprises stainless steel.

25. The apparatus of claim 17, wherein the cooling component comprises a vapor chamber.

* * * * *